(12) United States Patent
Roohparvar

(10) Patent No.: US 6,731,562 B2
(45) Date of Patent: May 4, 2004

(54) POWER VALIDATION FOR MEMORY DEVICES ON POWER UP

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 10/252,081

(22) Filed: Sep. 20, 2002

(65) Prior Publication Data
US 2003/0067831 A1 Apr. 10, 2003

Related U.S. Application Data

(62) Division of application No. 09/801,961, filed on Mar. 8, 2001, now Pat. No. 6,542,427.

(51) Int. Cl.⁷ .................................................. G11C 7/00
(52) U.S. Cl. ........................................ 365/226; 365/195
(58) Field of Search ................................. 365/226, 195

(56) References Cited

U.S. PATENT DOCUMENTS

| 5,581,206 A | 12/1996 | Chevallier et al. ........... 327/143 |
| 5,615,159 A | 3/1997 | Roohparvar ................ 365/201 |
| 5,677,885 A | 10/1997 | Roohparvar ................ 365/201 |
| 5,754,445 A | 5/1998 | Jouper et al. ............... 364/492 |
| 5,767,711 A | 6/1998 | Chevallier et al. .......... 327/143 |
| 5,831,909 A | * 11/1998 | Shirley ................... 365/189.07 |
| 6,046,615 A | 4/2000 | Chevallier et al. .......... 327/143 |
| 6,133,788 A | * 10/2000 | Dent ......................... 330/124 |
| 6,229,352 B1 | 5/2001 | Chevallier et al. ........... 327/77 |

FOREIGN PATENT DOCUMENTS

JP 61-194695 8/1986

OTHER PUBLICATIONS

Betty Prince, "Semiconductor Memories", 1983, Wiley 2$^{nd}$ edition, pp. 423–424*

* cited by examiner

Primary Examiner—M. Tran
(74) Attorney, Agent, or Firm—Leffert Jay & Polglaze, P.A.

(57) ABSTRACT

A multiple power supply connection memory that prohibits initialization until each power supply connection is powered up. Requiring all power supply connections to be powered up before initialization greatly increases the reliability of the memory. In one embodiment, low sense circuits are coupled to each power supply connection to monitor voltage levels. The memory can prohibit initialization and/or prohibit access operations until each power supply connection has an appropriate voltage level.

22 Claims, 3 Drawing Sheets

POWER VALIDATION FOR MEMORY DEVICES ON POWER UP

TECHNICAL FIELD OF THE INVENTION

This application is a divisional of U.S. patent application Ser. No. 09/801,961 filed Mar. 8, 2001 now U.S. Pat. No. 6,542,427 and titled, "POWER VALIDATION FOR MEMORY DEVICES ON POWER UP," which is commonly assigned and incorporated herein by reference. The present invention relates generally to memory devices and in particular the present invention relates to power validation of circuits of memory devices.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM is read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile.

Many memory devices include system circuits that need to be initialized before the memory can be powered up for reliable operation. A problem may arise when the memory device has multiple power supply connections. Some signals that work off the power supplied to one supply connection may need to interact with other signals that work off the power supplied to another supply connection. If one supply is fully powered up and the other is not fully powered up, the reliability of operations becomes questionable.

For the reasons stated above, and for other reasons stated below which will become apparent to those skilled in the art upon reading and understanding the present specification, there is a need in the art to verify power levels at the power supply connections before the system circuits are initialized.

SUMMARY OF THE INVENTION

The above-mentioned problems with integrated circuit dice having multiple power supply connections and other problems are addressed by the present invention and will be understood by reading and studying the following specification.

In one embodiment, each power supply connection is coupled to an associated low power sense circuit. Each low power sense circuit provides an output signal when a voltage is detected on its associated power supply connection that is above a predetermined threshold voltage. A logic circuit is coupled to the outputs of each low power sense circuit. When the output of each power sense circuit has been detected by the logic circuit, the logic circuit sends a signal to a control circuit. The control circuit then allows the memory to be initialized.

In another embodiment, a memory system comprises, an external processor, non-volatile memory having a plurality of power supply connections, a power validation circuit, an array of memory cells and a control unit. The non-volatile memory is coupled to the external processor. The power validation circuit is coupled to the plurality of power supply connections. The power validation circuit provides an output signal to indicate a status of each of the plurality of power supply connections relative to an associated threshold voltage. The control circuit controls memory operation functions of the array of memory cells in response to the output signal of the validation circuit.

A method of operating a memory having a plurality of power supply connections is described. The method comprises monitoring power supply voltages on power supply connections, comparing the power supply voltages on the power supply connections with an associated threshold voltage and ignoring externally provided commands while the power supply voltages are below a predetermined threshold voltage.

Another method of operating a memory having a plurality of power supply connections is described. The method comprises monitoring power supply voltages on power supply connections, comparing the power supply voltages on the power supply connections with an associated threshold voltage and prohibiting initialization of memory while power supply voltages are below predetermined threshold voltages.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Integrated circuit devices may require multiple power supply connections. An example of a recently developed integrated circuit device that requires multiple power source connections is a Synchronous Flash memory. Synchronous Flash memory combines the non-volatile storage capabilities of Flash memory with an SDRAM 100 mHz read-compatible interface. Because Synchronous Flash memory is designed to operate at low voltage levels and since the memory includes a lot of complex circuits that require independent power supplies, multiple power supply connections are provided.

Figure 1:
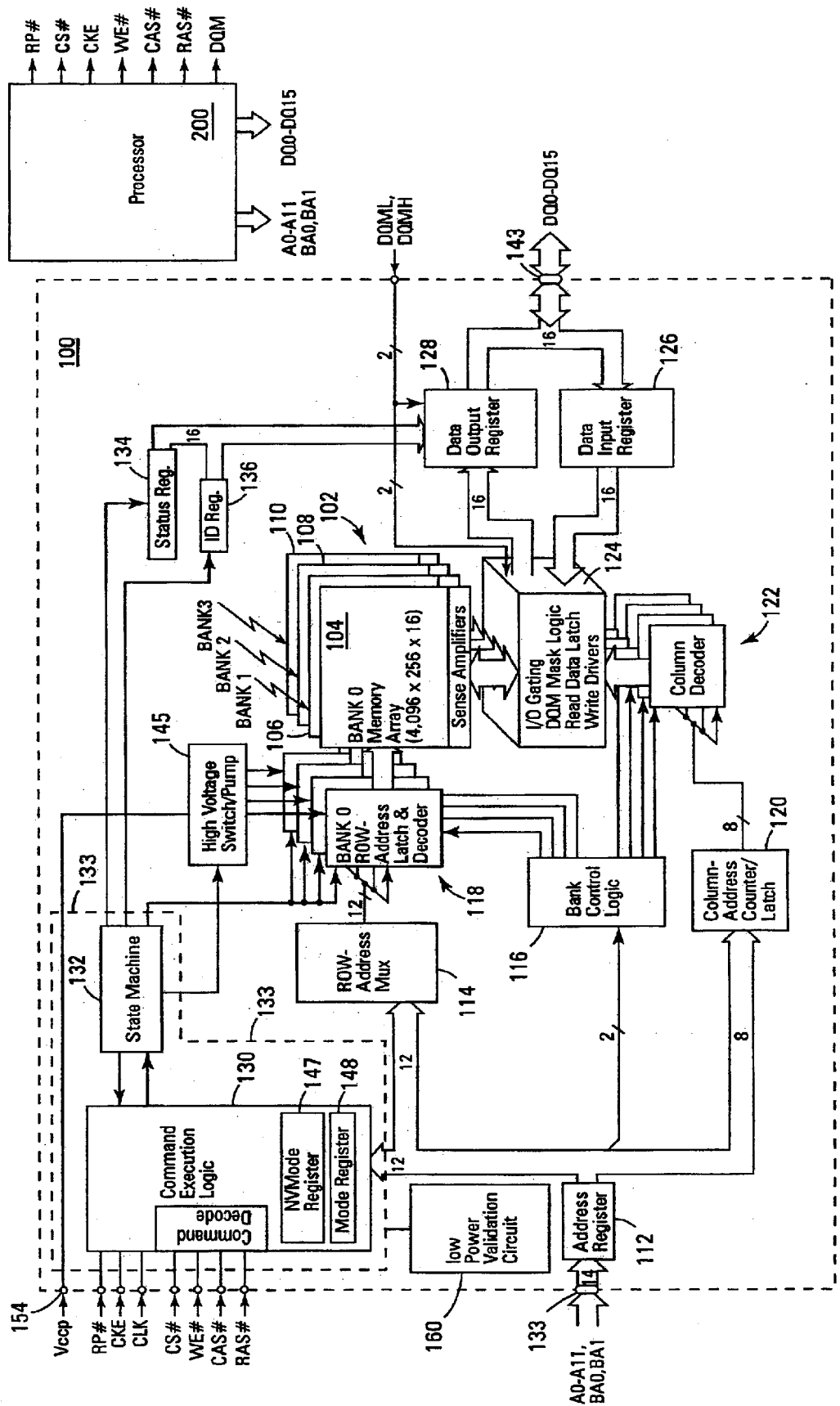
FIG. 1 is a block diagram of a synchronous flash memory of the present invention.

Referring to FIG. 1, a block diagram of one embodiment of a Synchronous Flash memory of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 via address signal connections. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128 via data connections. Command execution logic 130 is provided to control the basic operations of the memory device. A state machine 132 is also provided to control specific operations performed on the memory array and cells. A status register 134 and an identification register 136 can also be provided to output data. The command circuit 130 and/or state machine 132 can be generally referred to as the control circuit 138. The control circuit 138 controls read, write, erase and other memory operations. The data connections are typically used for bi-directional data communication. The memory can be coupled to an external processor 200 for operation or testing.

Figure 2:
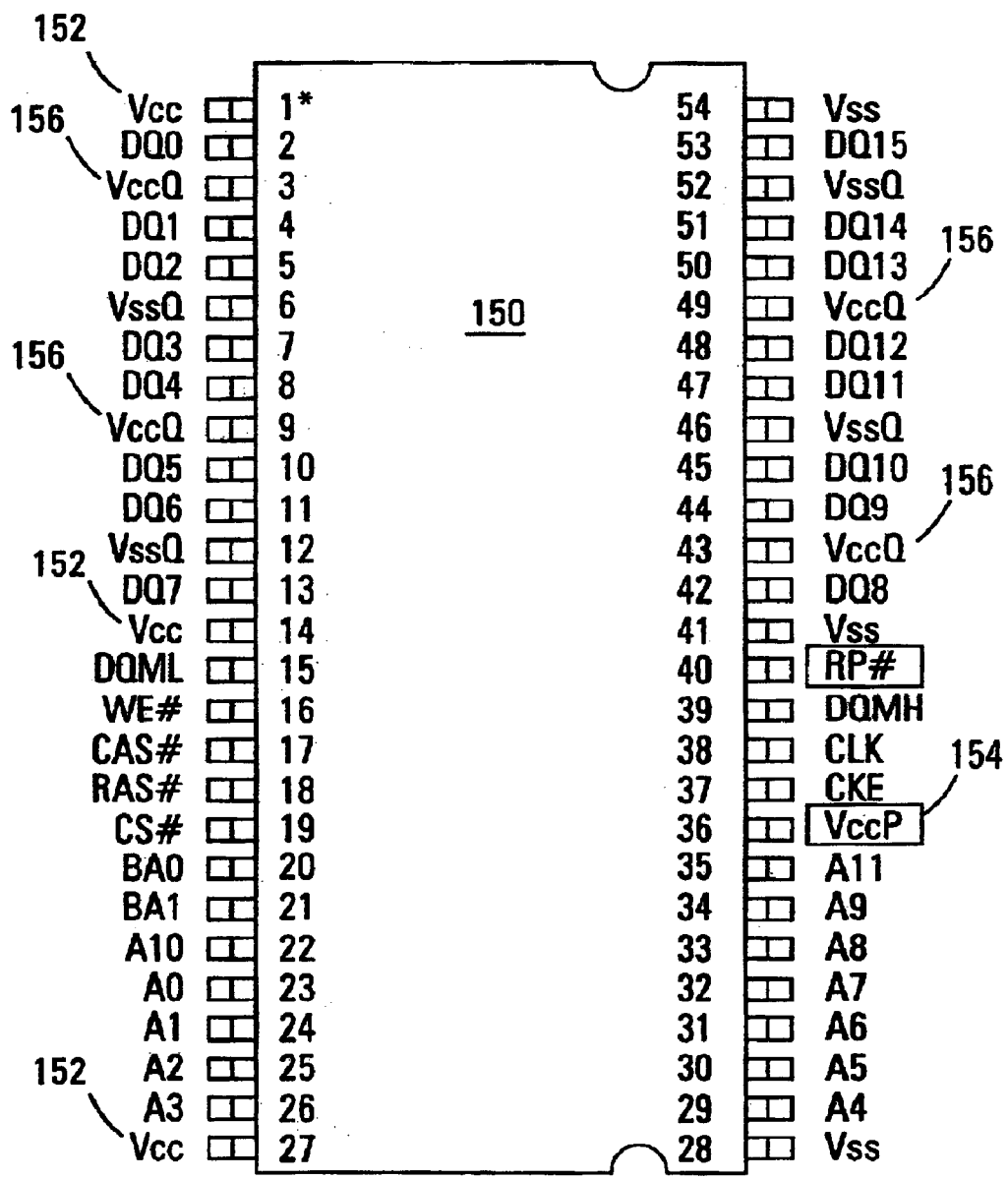
FIG. 2 illustrates an interconnect pin assignment of one embodiment of the present invention.

FIG. 2 illustrates an interconnect pin assignment of one embodiment of the present invention. The memory package 150 has 54 interconnect pins. The pin configuration is substantially similar to available SDRAM packages. Interconnects specific to the present invention are Vcc connection 152, Vccp connection 154 and Vccq connection 156. Although the present invention may share interconnect labels that appear the same as SDRAM's, the function of the signals provided on the interconnects are described herein and should not be equated to SDRAM's unless set forth herein.

Prior to describing the operational features of the memory device, a more detailed description of the interconnect pins and their respective signals is provided.

The input clock connection is used to provide a clock signal (CLK). A system clock can drive the clock signal, and all synchronous flash memory input signals are sampled on the positive edge of CLK. CLK also increments an internal burst counter and controls the output registers.

The input clock enable (CKE) connection is used to activate (HIGH state) and deactivates (LOW state) the CLK signal input. Deactivating the clock input provides POWER-DOWN and STANDBY operation (where all memory banks are idle), ACTIVE POWER-DOWN (a memory row is ACTIVE in either bank) or CLOCK SUSPEND operation (burst/access in progress). CKE is synchronous except after the device enters power-down modes, where CKE becomes asynchronous until after exiting the same mode. The input buffers, including CLK, are disabled during power-down modes to provide low standby power. CKE may be tied HIGH in systems where power-down modes (other than RP# deep power-down) are not required.

The chip select (CS#) input connection provides a signal to enable (registered LOW) and disable (registered HIGH) a command decoder provided in the command execution logic. All commands are masked when CS# is registered HIGH. Further, CS# provides for external bank selection on systems with multiple banks, and CS# can be considered part of the command code; but may not be necessary.

The input command input connections for RAS#, CAS#, and WE# (along with CAS#, CS#) define a command that is to be executed by the memory. The input/output mask (DQM) connections are used to provide input mask signals for write accesses and an output enable signal for read accesses. Input data is masked when DQM is sampled HIGH during a WRITE cycle. The output buffers are placed in a high impedance (High-Z) state (after a two-clock latency) when DQM is sampled HIGH during a READ cycle. DQML corresponds to data connections DQ0–DQ7 and DQMH corresponds to data connections DQ8–DQ15. DQML and DQMH are considered to be the same state when referenced as DQM.

Address inputs 133 are primarily used to provide address signals. In the illustrated embodiment the memory has 12 lines (A0–A11). Other signals can be provided on the address connections, as described below. In one embodiment of the present invention, test mode codes are received by the memory via the address inputs. The address inputs are sampled during an ACTIVE command (row-address A0–A11) and a READ/WRITE command (column-address A0–A7) to select one location in a respective memory bank. The address inputs are also used to provide an operating code (OpCode) during a LOAD COMMAND REGISTER operation, explained below. Address lines A0–A11 are also used to input mode settings during a LOAD MODE REGISTER operation.

An input reset/power-down (RP#) connection is used for reset and power-down operations. Upon initial device power-up, a 100 μs delay after RP# has transitioned from LOW to HIGH is required in one embodiment for internal device initialization, prior to issuing an executable command. The RP# signal clears the status register, sets the internal state machine (ISM) to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. The Vccq connection 156 is used to provide isolated power to the DQ connections to improved noise immunity. In one embodiment, Vccq=Vcc or 1.8 V ±0.15V. The Vssq connection is used to isolated ground to DQs for improved noise immunity. The Vcc connection 152 provides a power supply, such as 3V. A ground connection is provided through the Vss connection. Another optional voltage is provided on the Vccp connection 144. The Vccp connection 154 can be tied externally to Vcc connection 152, and sources current during device initialization, WRITE and ERASE operations. That is, writing or erasing to the memory device can be performed using a Vccp voltage, while all other operations can be performed with a Vcc voltage. The Vccp connection 144 is coupled to a high voltage switch/pump circuit 145.

The following sections provide a more detailed description of the operation of the synchronous flash memory. One embodiment of the present invention is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 256K-word hardware and software lockable blocks. The memory's four-bank architecture supports true concurrent operations.

A read access to any bank can occur simultaneously with a background WRITE or ERASE operation to any other bank. The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation. In general, the synchronous flash memory is configured similar to a multi-bank DRAM that operates at low voltage and includes a synchronous interface. Each of the banks is organized into rows and columns.

The synchronous flash is powered up and initialized in a predefined manner. After power is applied to Vcc connection 152, Vccp connection 154 and Vccq connection 156 (simultaneously), and the clock signal is stable, RP# 140 is brought from a LOW state to a HIGH state. A delay, such as a 100 μs delay, is needed after RP# transitions HIGH in order to complete internal device initialization. After the delay time has passed, the memory is placed in an array read mode and is ready for Mode Register programming or an executable command. After initial programming of a non-volatile mode register 147 (NVMode Register), the contents are automatically loaded into a volatile Mode Register 148 during the initialization. The Mode Register 148 is used to define the specific mode of operation of the synchronous flash memory. The device will power up in a programmed state and will not require reloading of the non-volatile mode register 147 prior to issuing operational commands.

A power validation circuit 160 is used for monitoring the voltage levels on the power supply connections 152, 154 and 156. The power validation circuit 160 produces an output signal that is monitored by control circuit 138. The output signal indicates that the voltage levels on each power supply connection 152, 154 and 156 has reached an associated predetermined threshold voltage. Each predetermined threshold voltage is set to indicate a voltage level required for normal operations of the system circuits coupled to an associated power supply connection. Once the associated threshold voltage has been reached on each power supply connection, the power supply voltages are considered powered up.

The control circuit 138 is designed to prevent normal operation of the memory (memory accesses) until the proper output signal from the power validation circuit 160 is received. Thus, the memory does not respond to external commands until all of the voltages on the power supply connections 152, 154 and 156 have reached their respective predetermined threshold voltages. Further, the power validation circuit prohibits initialization of the memory until the voltage level on each power supply connection 152, 154 and 156 has reached its respective predetermined threshold voltage.

Figure 3:
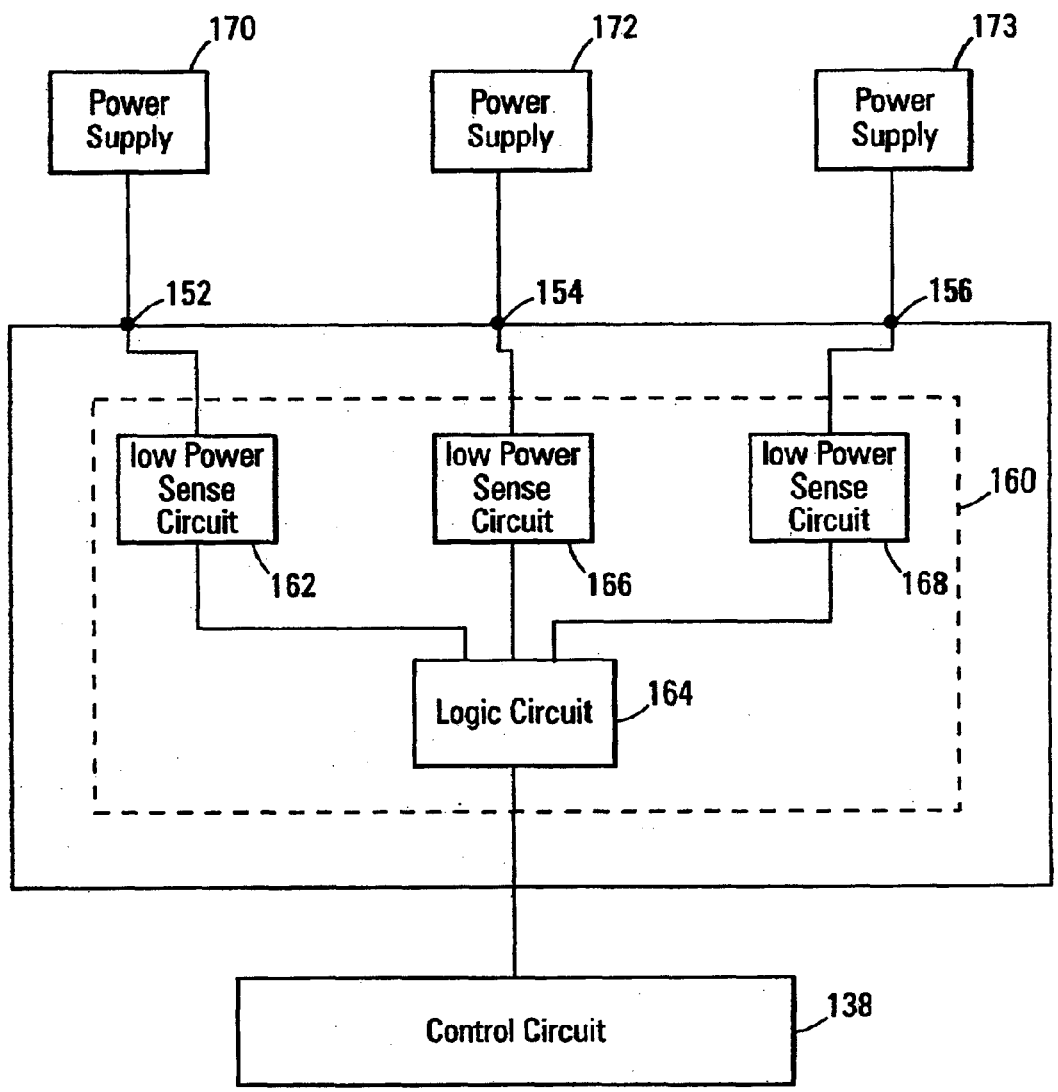
FIG. 3 is a simplified block diagram of one embodiment of the power validation circuit of the present invention.

As illustrated in FIG. 3, one embodiment of the power validation circuit 160 includes a plurality of low power sense circuits 162, 166 and 168 and a logic circuit 164. Each low power sense circuit 162, 166 and 168 is coupled to an associated power supply connection 152, 154 or 156. Moreover, each low power sense circuit 162, 166 and 168 produces an output signal that indicates when its associated power supply connection has reached its predetermined threshold voltage. The outputs of each low power sense circuit 162, 166 and 168 are coupled to the logic circuit 164. The logic circuit 164 produces an output signal when output signals from each low power sense circuit 162, 166 and 168 indicate that the voltages on each power supply connection 152, 154, and 156 are above their respective threshold voltage. The output of the logic circuit 164 is coupled to the control circuit 138.

Independent power supplies that include a first power supply 170, a second power supply 171 and a third power supply 172 provide power to the power supply connections 152, 154 and 156, as illustrated in FIG. 3. In addition, power supply connections 152, 154 and 156 may require different levels of voltage. Therefore, the voltage supplies will have different voltage levels. For example, the first power supply 170 may have X volts, the second power supply 154 may have Y volts and the third power supply 156 may have Z volts. Where X, Y and Z are not equal to each other. Moreover, some of the power connections may require the same voltage level but require separate power supplies because of current requirements of internal system circuits. In this example, X may equal to Y, Y may be equal to Z, X may be equal to Z or X, Y and Z may all be equal to each other.

As memory systems develop, added power supply connections with independent power supplies may be required. The number of low power sense circuits can be added to verify power levels on each of the added power supply connections. The outputs of each low power sense circuit may be coupled to a logic circuit as described above. Moreover, the logic circuit may then send a signal to the control circuit when all low power sense circuits have verified that their predetermined threshold voltage levels have been detected. The control circuit can prevent normal operation of the memory accesses until the signal is sent from the logic circuit.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device having a plurality of power supply connections comprising:

a power validation circuit to monitor voltage levels on each power supply connection and provide an output signal that indicates when all of the power supply connections have a voltage level above an associated predetermined threshold voltage; and a control circuit coupled to the power validation circuit, wherein the control circuit prohibits operation of the memory in response to externally provided commands until the output signal from the power validation circuit indicates that all of the power supply connections have an acceptable voltage level.

2. The memory device of claim 1 wherein the power validation circuit further comprises:

a plurality of low power sense circuits each coupled to an associated power supply connection, wherein each low power sense circuit provides a threshold signal when a voltage is detected on an associated power supply connection that exceeds a predetermined threshold voltage; and a logic circuit coupled to the outputs of the each low power sense circuit, wherein the logic circuit produces an indication signal in response to receiving the threshold signals from all of the plurality of low power sense circuits.

3. The memory system of claim 2 wherein the logic circuit provides a logic and function.

4. The memory device of claim 1 wherein each power supply connection is coupled to receive a different power supply voltage.

5. The memory device of claim 1 wherein at least two of the power supply connections are coupled to a common power supply.

6. A method of operating a memory comprising:

monitoring power supply voltages on a plurality of power supply connections; and ignoring externally provided commands while each of the plurality of power supply voltages are below an associated predetermined threshold voltage.

7. The method claim of 6 wherein one of the predetermined threshold voltages is X volts and a second one of the predetermined threshold voltages is Y volts.

8. The method claim of 7 wherein X and Y are not equal.

9. A method of operating a memory having multiple power supply connections comprising:

monitoring a power supply voltage on each of the multiple power supply connections; and prohibiting initialization of the memory while the power supply voltages are below associated predetermined threshold voltages.

10. The method claim of 9 wherein one of the threshold voltages is X volts and a second one of the threshold voltages is Y volts.

11. A method of operating a memory having multiple power supply connections comprising:

generating an associated reference voltage for each of the power supply connections;

comparing a voltage on each of the power supply connections with its associated reference voltage; and prohibiting initialization of the memory while all power supply voltages are below their associated reference voltages.

12. The method claim of 11 wherein one reference voltage is X volts and a second reference voltage is Y volts.

13. The method claim of 11 wherein X and Y are not equal.

14. A method of operating a memory having multiple power supply connections comprising:

monitoring a power supply voltage on each of the multiple power supply connections; and prohibiting initialization of the memory until each of the power supply voltages have been powered up.

15. The method of claim 14 further comprising:

comparing the power supply voltage on each power supply connection with a respective predetermined threshold voltage.

16. The method claim of 15 wherein one of the threshold voltages is X volts and a second one of the threshold voltages is Y volts.

17. The method claim of 16 wherein X and Y are not equal.

18. A method of operating a memory system comprising:

receiving a power supply voltage on each of multiple power supply connections of a memory;

monitoring each of the power supply voltages on the power supply connections; comparing each power supply voltage on each power supply connection with an associated predetermined threshold voltage;

the memory receiving commands from a microprocessor; and ignoring the commands from the microprocessor while the power supply voltage on each power supply connection is below its associated predetermined threshold voltage.

19. The method of claim 18 further comprising:

prohibiting initialization of the memory while the power supply voltage on each power supply connection is below its associated predetermined threshold voltage.

20. The method of claim 19 wherein the microprocessor commands include read, write or erase commands.

21. A method of operating a memory system comprising:
  receiving a power supply voltage on each of multiple power supply connections of a memory;
  monitoring the power supply voltage on each power supply connections;
  comparing the power supply voltage on each power supply connection with an associated predetermined threshold voltage; and
  prohibiting the memory from performing predefined operations while the power supply voltage on each power supply connection is below its associated predetermined threshold voltage.

22. The method of claim 21 wherein the predefined operations include initializing the memory.

* * * * *